United States Patent [19]
Liang

[11] Patent Number: 5,804,485
[45] Date of Patent: Sep. 8, 1998

[54] HIGH DENSITY METAL GATE MOS FABRICATION PROCESS

[76] Inventor: Wei-Chen Liang, 10F-3, No. 25, Lane 23, Guang-Tung Rd., Hsin-Chu City, Taiwan

[21] Appl. No.: 805,568

[22] Filed: Feb. 25, 1997

[51] Int. Cl.⁶ .................................................. H01L 21/336
[52] U.S. Cl. ........................... 438/299; 438/301; 438/307
[58] Field of Search ..................... 438/299, 301, 438/303, 305, 306, 307, 174, 185, 188

[56] References Cited

U.S. PATENT DOCUMENTS

| | | | |
|---|---|---|---|
| 4,049,477 | 9/1977 | Ligon | 438/299 |
| 4,114,254 | 9/1978 | Aoki et al. | 438/299 |
| 4,209,349 | 6/1980 | Ho et al. | 438/301 |
| 4,409,722 | 10/1983 | Dockerty et al. | 438/283 |
| 5,376,578 | 12/1994 | Hsu et al. | 438/305 |

*Primary Examiner*—Michael Trinh
*Attorney, Agent, or Firm*—Rosenberg, Klein & Bilker

[57] ABSTRACT

A high density metal gate metal-oxide semiconductor fabrication process to selectively and locally oxidize specific regions of a wafer without increasing the numbers of mask, so as to separately control the thickness of the oxide at the gate, P+ zones and N+ zones, the process including the step of forming a first tye trap zone, the step of forming a shielding layer consisting of an oxide pad and a nitride layer, and the step of forming an oxide layer and removing the nitride layer but the oxide pad to be left before the growing of an insulative oxide layer.

6 Claims, 6 Drawing Sheets

HIGH DENSITY METAL GATE MOS FABRICATION PROCESS

BACKGROUND OF THE INVENTION

The present invention relates to high density metal gate MOS (metal-oxide-semiconductor) fabrication process, and more particularly to such a high density metal gate MOS fabrication process which selectively and locally oxidizes specific regions on a semiconductor wafer without increasing the number of mask, so as to separately control the thickness of the oxide at the gate, P+ zones and N+ zones. A variety of semiconductors have been developed, and intensively used in electronic consumer goods and large scale integrated circuits. Figures from 1A to 1I show a metal-oxide-semiconductor fabrication process according to the prior art. The fabrication process includes the steps of:

1. forming a P-type (first type) trap zone 2 at a particular region on a N-type (second type) wafer 1 (see FIG. 1A);
2. forming an oxide layer 20 on the surface of the N-type wafer 1 (see FIG. 1B);
3. a window 22 is lithographically defined and then etched in the oxide layer 20, and then driving P-type ions 25 implant in the P-type trap zone 2 by means of an ion implantation or diffusion to form two P+ zones 24 (first type doping zones) serving as an isolated annular protecting region of the element (see FIG. 1C);
4. growing an oxide layer 30 from the P-type trap zone 2 anew, then a window 32 is opening in particular location of the oxide layer 30 by lithogrpahy, and then removing the oxide layer 30 from the position within the window 32 by etching, and then driving N-type ions 35 implant in the P-type trap zone 2 by means of an ion implanting or diffusing method to form two N+ zones 34 (second type doping zones) serving as the source and drain of the element (see FIG. 1D);
5. removing all of the oxide layer 30 (see FIG. 1E);
6. growing a new insulating oxide layer 40, the thickness of the insulating oxide layer 41 at the P+ zones is approximately equal to the thickness of the insulating oxide layer 45 at the gate (under the dimensions of oxide layer), and the thickness of the insulating oxide layer 42 at the N+ zones is about 3–5 times of the thickness of the insulating oxide layers 41, 45 at the P+ zones and the gate (see FIG. 1F);
7. forming a contact window 47 at a particular location by lithography and etching for further connection between conductors and the N+ zones 34 or P+ zones 24 (see FIG. 1G);
8. using polysilicon or aluminum as base material to grow a metal layer 49 from the whole region of the wafer, then a window 52 is opening at a particular location by lithography and etching, so as to define the positions for the gate 48 and the metal conductors 51, and then finishing the processing and patterning of the gate 48 and the metal conductors 51 by metallization (see FIG. 1H); and
9. growing a protective layer 50 is deposited over the entire wafer, then a window is lithographically defined and then etched in the oxide layer from the protective layer 50 to desired metal contacts 53, so as to obtain a finished metal-oxide-semiconductor (see FIG. 1I).

According to the aforesaid process, the thickness of the insulating oxide layer 45 at the gate is approximately equal to that of the insulating oxide layer 41 at the P+ zones, this limits the designable program of the production engineers. If the insulating oxide layer 40 is designed thicker, it will affect the driving of electric current and limit the operating speed of the element; if to make the insulating oxide layer 40 thinner, the parasitic capacitance value of the oxide layer will be excessively high, causing the element unable to transmit signal, and the packing density of the element on the wafer shall be relatively reduced, and the function of the product will be unable to be fully carried out.

In order to selectively and locally oxidize specific regions on the semiconductor wafer, production engineers may apply masks to the wafer at different locations, so that the oxide layer can be made of different thickness at different locations. However, this application of masks greatly increases the manufacturing cost of the metal-oxide semiconductor.

SUMMARY OF THE INVENTION

The present invention has been accomplished to provide a high density metal gate MOS fabrication process which eliminates the aforesaid drawbacks. It is one object of the present invention to provide a high density metal gate MOS fabrication process which permits the specific regions on the wafer to be selectively and locally oxidized to make an oxide layer having different thickness at the metal gate, P+ zones and N+ zones, so that the fabrication engineers can freely design the desired product It is another object of the present invention to provide a high density metal gate MOS fabrication process which greatly increases the packing density of the element on the wafer, improves the operating speed of the product and its function without increasing the number of masks. It is still another object of the present invention to provide a high density metal gate MOS fabrication process which is easy and economic to perform, so that the manufacturing cost of the finished product can be greatly reduced.

According to the present invention, the high density metal gate metal-oxide semiconductor fabrication process includes the steps of i) forming a first type trap zone within a specific region on a second type semiconductor wafer; ii) forming a shielding layer by thermally growing a thin oxide pad from the second type wafer and followed by a nitride layer deposition; iii) a window is lithographically defined and then etched in the shielding layer, and then driving first type ions implant in the first type trap zone by means of an ion implanting or diffusing method to form first type doping regions; iv) growing an oxide layer from the first trap zone, then a window is opening in particular location of the shielding layer by lithography and then removing the shielding layer from the position within the window by etching, and then driving N-type ions implant in the first type trap zone an ion implantation or diffusion, to form two second type doping zones beyond the first type doping zones for serving as the source and drain; v) growing an oxide layer, then removing the residual nitride layer and the oxide pad to be left; vi) removing the oxide pad, then growing a new insulating oxide layer; vii) forming a contact window; viii) forming a gate and metal layer conductors by metallization; and ix) processing a protective layer.

BRIEF DESCRIPTION OF THE DRAWINGS

FIGS. from 1A to 1I are sectional views showing the structures finished at every step of a metal gate MOS (metal-oxide-semiconductor) fabrication process according to the prior art; and FIGS. from 2A to 2I are sectional views showing the structures finished at every step of a metal gate MOS (metal-oxide-semiconductor) fabrication process according to the present invention.

DETAILED DESCRIPTION OF THE PREFERRED EMBODIMENT

Figure 1A:
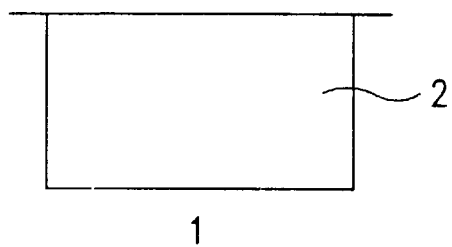
Figure 2A:
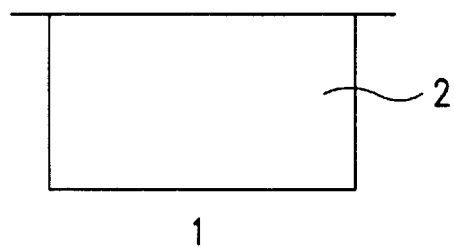
Figure 1B:
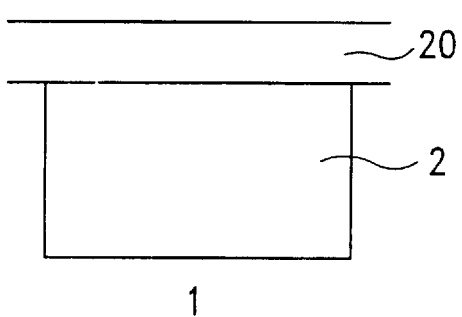
Figure 2B:
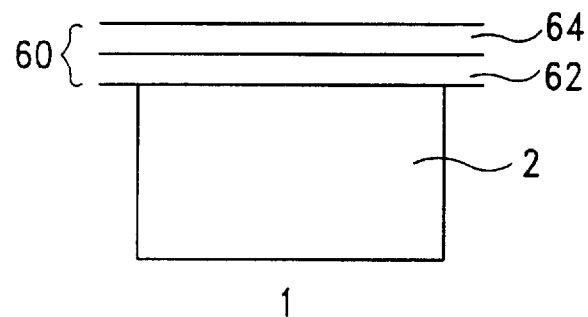
Figure 1C:
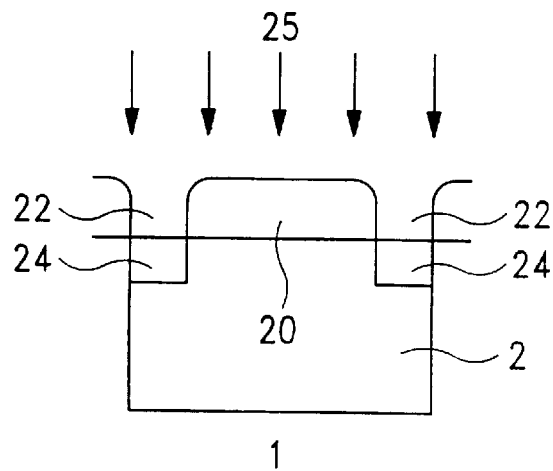
Figure 2C:
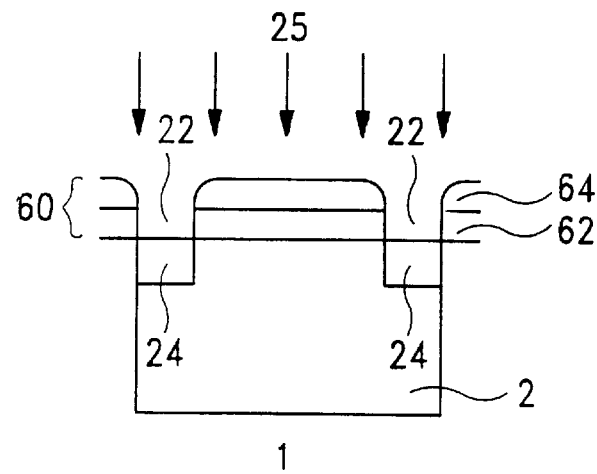
Figure 1D:
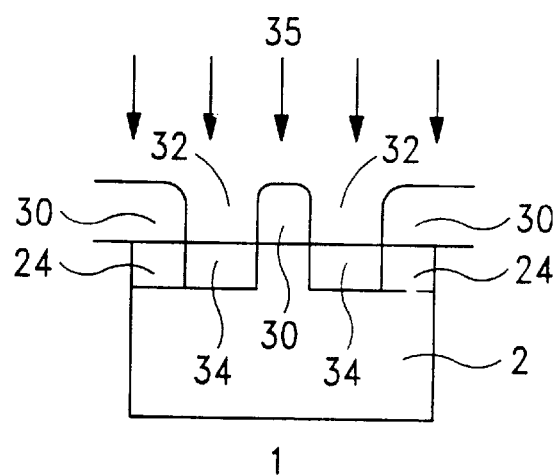
Figure 2D:
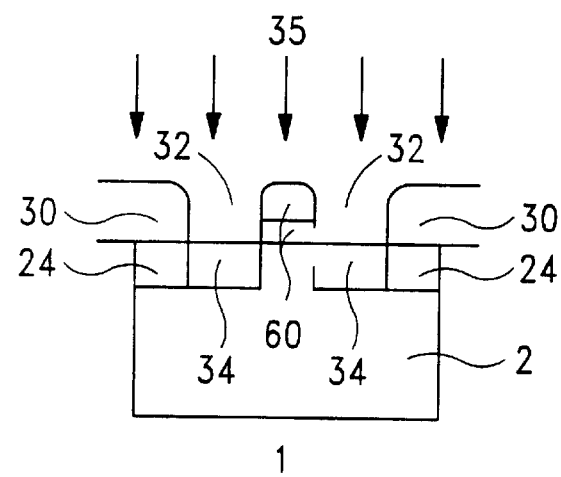
Figure 1E:
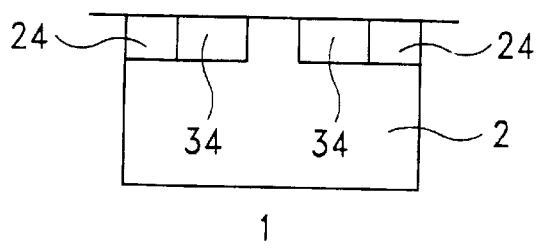
Figure 2E:
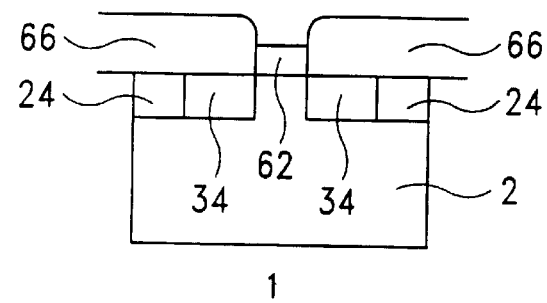
Figure 1F:
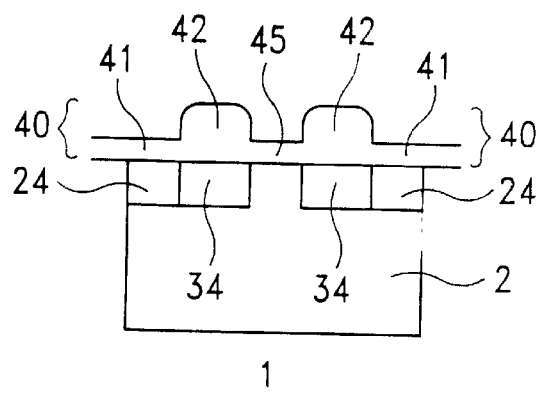
Figure 2F:
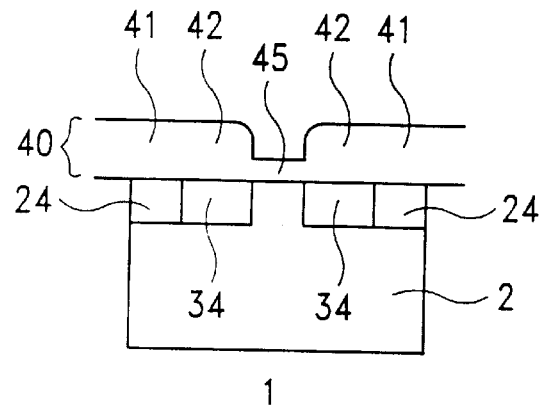
Figure 1G:
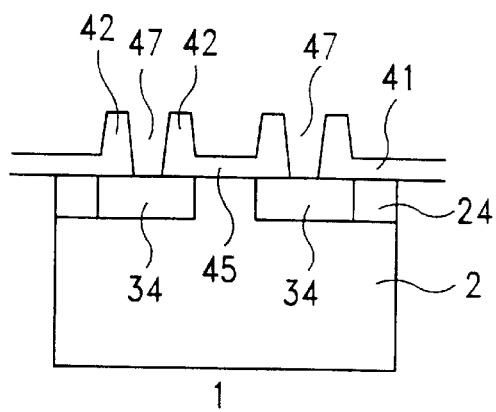
Figure 2G:
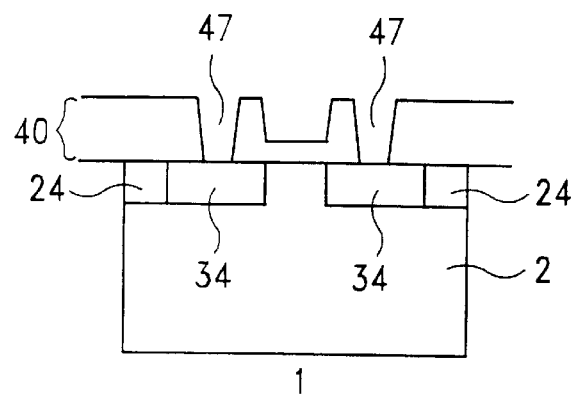
Figure 1H:
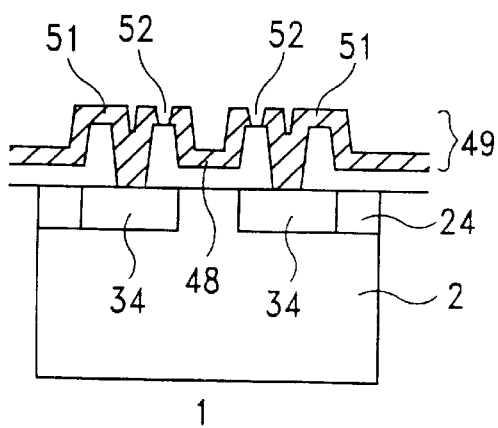
Figure 2H:
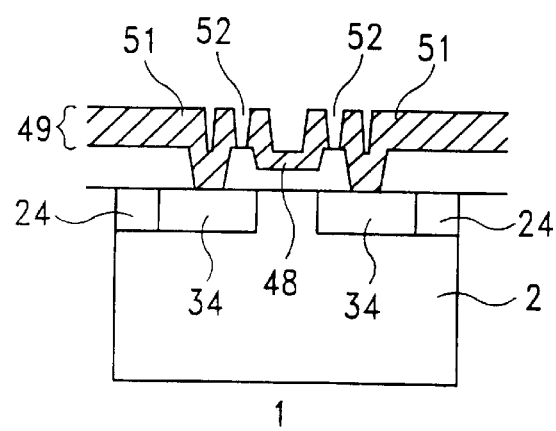
Figure 1I:
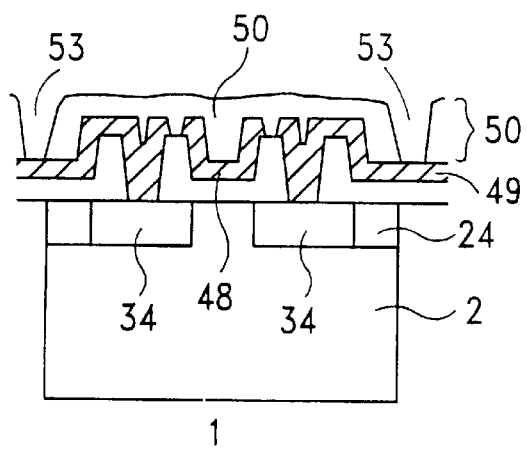
Figure 2I:
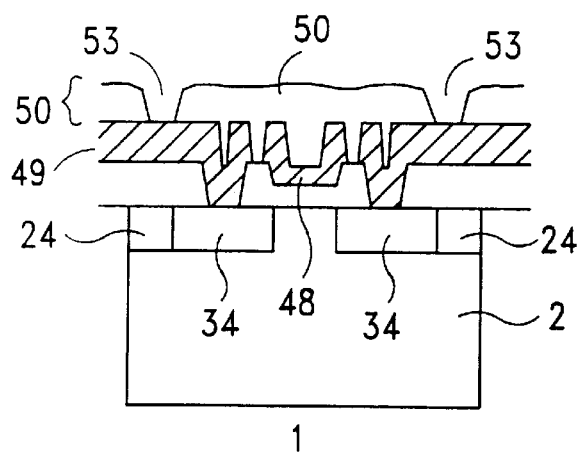
Figures 1, 2D:
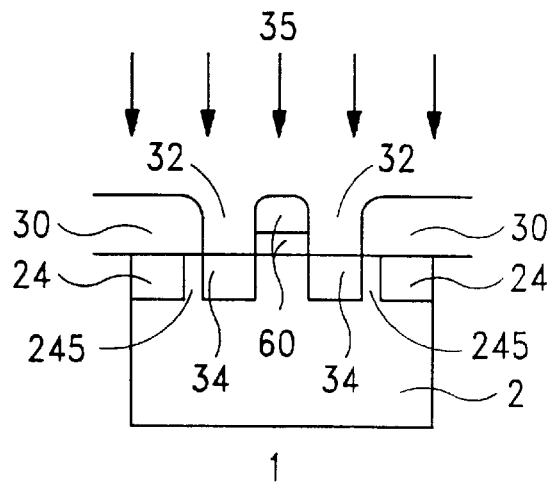
Figures 1, 2E:
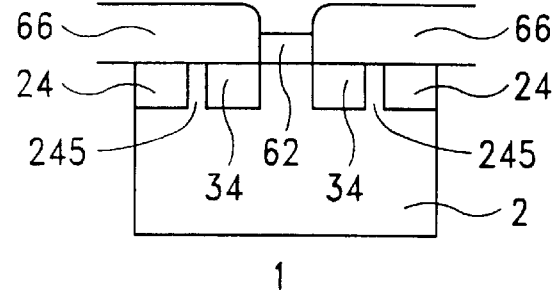
Figures 1, 2I:
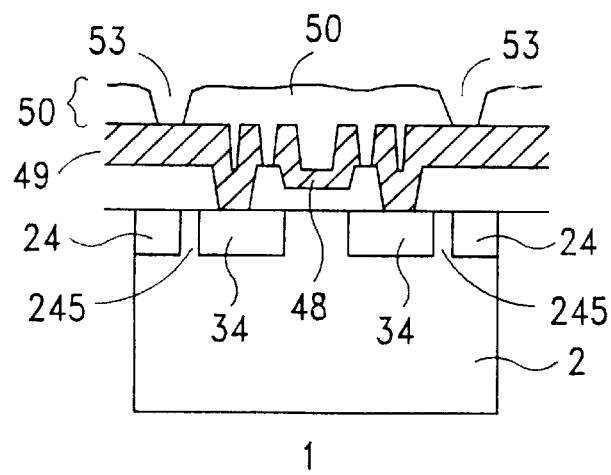

Referring to FIG. from 2A to 2I, a high density metal gate MOS (metal-oxide-semiconductor) fabrication process in accordance with the present invention, comprises the steps of:

1. forming a P-type (first type) trap zone 2 at a particular region on a N-type semiconductor wafer 1 (see FIG. 2A);
2. forming a shielding layer 60 on the surface of the N-type wafer 1 by: thermally growing a thin oxide pad 62 from the N-type wafer 1 and followed by a nitride layer 64 deposition to the oxide pad 62 (see FIG. 2B);
3. a window 22 is lithographically defined and then etched the shielding layer 60, and then driving P-type ions 25 implant in the P-type trap zone 2 by means of an ion implanting or diffusing method to form two P+ zones 24 (first type doping zones) serving as an isolated annular protecting region of the element (see FIG. 2C);
4. growing an oxide layer 30 from the P-type trap zone 2 anew (because the oxide layer 30 cannot be grown from the nitride layer 64, the thickness of the shielding layer 60 does not change when the oxide layer 30 is grown, and the oxide layer 30 is grown from the P+ zones 24 only), then a window 32 is opening in particular location of the shielding layer 60 by lithography, and then removing the shielding layer 60 from the position within the window 32 by etching, and then driving N-type ions 35 implant in the P- type trap zone 2 ion implantation or diffusion to form two N+ zones 34 (second type doping zones) beyond the P-type doping zones for serving as the source and drain of the element (see FIG. 2D);
5. growing an oxide layer 66, permitting the thickness of the oxide layer 66 at the P+ zones 24 to be maintained approximately equal to that at the N+ zones 34, then removing the residual nitride layer 64, permitting the oxide pad 62 to be left (see FIG. 2E);
6. removing the oxide pad 62, then growing a new insulating oxide layer 40, permitting the insulating oxide layer 41 at the P+ zones to be maintained thicker than the thickness of the insulating oxide layer 45 at the gate, so that the thickness of the oxide layer at the P+ zones 24, the N+ zones 34 and the gate can be selectively and locally controlled (see FIG. 2F);
7. forming a contact window 47 at a particular location by lithography and etching for further connection between conductors and the N+ zones 34 or P+zones 24 (see FIG. 2G);
8. using polysilicon or aluminum as base material to grow a metal layer 49 from the whole region of the wafer, then a window 52 is opening at a particular location by lithography and etching, so as to define the positions for the gate 48 and the metal conductors 51, and then finishing the processing and patterning of the gate 48 and the metal conductors 51 by metallization (see FIG. 2H);
9. processing a protective layer 50 is deposited over the entire wafer, then a window is lithographically defined and then etched in the oxide layer from the protective layer 50 to desired metal contacts 53, so as to obtain selectively and locally oxidize specific regions of a finished metal-oxidesemiconductor (see FIG. 2I).

From the aforesaid processing procedure, the thickness of the oxide layer at the gate is obviously different from that at the P+ zones and the N+ zones. This design option allows the production engineers to make the oxide layer at the gate relatively thinner for easy driving of electric current, so that the operating speed of the element can be greatly improved. Further, the thickness of the oxide layer below the metal layer can be made thicker, so as to reduce the parasitic capacitance value. Therefore, the present invention can greatly increase the packing density of the element on the wafer, and improve the function of the product. Because the process improves the function of the product without increasing the numbers of the mask, the manufacturing cost can be relatively reduced.

To adjust the metal gate MOS to in high voltage application and has higher breakdown voltages according to the present invention, the step 4 in the aforesaid fabrication process is converted into step 4-1. The step 4-1 is forming separatory areas 245 next to the first type doping zones 24 by lithographically defined and then etched the shielding layer 60 before be growing an oxide layer 30 from the P-type trap zone 2 anew, then a window 32 is opening in particular location of the shielding layer 60 by lithography, and then removing the shielding layer 60 form the position within the window 32 by etching, and then driving N-type ions 35 implant in the P-type trap zone 2 ion implantation or diffusion to from two $N^+$ zones 34 (second type doping zones) beyond the separatory area 245 for serving as the source and drain of the element (see FIG. 2D-1, 2E-1 and 2I-1).

The aforesaid example explains the process of a NMOS in which the first type means the P type, and the second type means the N type. For the process of a PMOS according to the aforesaid fabrication process, the first type means the N type, and the second type means the P type.

It is to be understood that the drawings are designed for purposes of illustration only, and are not intended as a definition of the limits and scope of the invention.

What the invention claimed is:

1. A high density metal gate metal-oxide semiconductor fabrication process including the steps of:
    i) forming a first type trap zone within a specific region on a second type semiconductor wafer;
    ii) forming a shielding layer by thermally growing a thin oxide pad from said second type wafer and followed by a nitride layer deposition;
    iii) a window is lithographically defined and then etched in said shielding layer, and then driving first type ions implant in said first type trap zone by means of an ion implanting or diffusing method to form first type doping regions;
    iv) growing an oxide layer from said first trap zone, then a window is opening in particular location of said shielding layer by lithography and then removing said shielding layer from said location within said window by etching, and then driving N-type ions implant in said first type trap zone by implantation or diffusion to form two second type doping zones beyond said first type doping zones for serving as the source and drain;
    v) growing an oxide layer, and then removing said residual nitride layer and said oxide pad to be left;
    vi) removing said oxide pad, then growing a new insulating oxide layer;
    vii) forming a contact window;
    viii) forming a gate and metal layer conductors by metallization; and ix) processing a protective layer.

2. The high density metal gate metal-oxide semiconductor fabrication process of claim 1, wherein said first type is P type, and said second type is N type.

3. The high density metal gate metal-oxide semiconductor fabrication process of claim 1, wherein said first type is N type, and said second type is P type.

4. A high density metal gate-oxide semiconductor fabrication process including the step of:

i) forming a first type trap zone within a specific regions on a second type semiconductor wafer;

ii) forming a shielding layer by thermally growing a thin oxide pad from said second type wafer and followed by a nitride layer deposition;

iii) a window is lithographically defined and then etched in said shielding layer, and then driving first type ions implant in said first type trap zone by means of an ion implanting or diffusing method to form first type doping regions;

iv) forming separatory arm next to said first type doping regions by lithography and etching before be growing an oxide layer from said first trap zone, then removing said shielding layer from said location within said window by etching, and then driving N-type ions implant in said first type trap zone by implantation or diffusion to form two second type doping zones beyond said separatory areas for serving as the source and drain;

v) growing an oxide layer, and then removing said residual nitride layer and said oxide pad to be left;

vi) removing said oxide pad, then growing a new insulating oxide layer;

vii) forming a contact window;

viii) forming a gate and metal layer conductors by metallization; and ix) processing a protective layer.

5. The high density metal gate metal-oxide semiconductor fabrication process of claim 4, wherein said first type is P type, and said second type is N type.

6. The high density metal gate metal-oxide semiconductor fabrication process of claim 4, wherein said first type is N tape, and said second type is P type.

* * * * *

UNITED STATES PATENT AND TRADEMARK OFFICE
CERTIFICATE OF CORRECTION

PATENT NO.   : 5,804,485
DATED        : SEPTEMBER 8, 1998
INVENTOR(S)  : WEI-CHEN LIANG

It is certified that error appears in the above-identified patent and that said Letters Patent is hereby corrected as shown below:

On the title page, Item

--[73] Assignee: MIRACLE TECHNOLOGY CO., LTD.,
              HSINCHU CITY, TAIWAN, R.O.C.--

Signed and Sealed this

Twenty-fourth Day of October, 2000

Attest:

Q. TODD DICKINSON

Attesting Officer

Director of Patents and Trademarks